United States Patent
Suh

(10) Patent No.: US 7,357,293 B2
(45) Date of Patent: Apr. 15, 2008

(54) SOLDERING AN ELECTRONICS PACKAGE TO A MOTHERBOARD

(75) Inventor: Daewoong Suh, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 350 days.

(21) Appl. No.: 10/808,192

(22) Filed: Mar. 24, 2004

(65) Prior Publication Data

US 2005/0210673 A1    Sep. 29, 2005

(51) Int. Cl.
*B23K 31/02*   (2006.01)

(52) U.S. Cl. ............... 228/180.21; 228/180.22; 228/254

(58) Field of Classification Search ............... None
See application file for complete search history.

(56) References Cited

U.S. PATENT DOCUMENTS

| 5,038,996 | A * | 8/1991 | Wilcox et al. ............... 228/121 |
| 6,297,142 | B1 * | 10/2001 | Mita et al. .................. 438/612 |
| 6,330,967 | B1 * | 12/2001 | Milewski et al. ...... 228/180.22 |
| 6,426,548 | B1 * | 7/2002 | Mita et al. .................. 257/673 |
| 6,762,495 | B1 * | 7/2004 | Reyes et al. ................. 257/737 |
| 6,800,169 | B2 * | 10/2004 | Liu et al. ..................... 156/292 |
| 6,847,118 | B2 * | 1/2005 | Milewski et al. ........... 257/738 |
| 6,857,557 | B2 * | 2/2005 | Hua ....................... 228/180.22 |
| 6,869,750 | B2 * | 3/2005 | Zhang et al. ................ 430/312 |
| 6,871,775 | B2 * | 3/2005 | Yamaguchi et al. ........ 228/215 |
| 6,884,313 | B2 * | 4/2005 | Liu et al. ..................... 156/292 |
| 6,994,243 | B2 * | 2/2006 | Milewski et al. ...... 228/180.22 |
| 2002/0036227 | A1 * | 3/2002 | Milewski et al. ........... 228/246 |
| 2002/0129894 | A1 * | 9/2002 | Liu et al. ..................... 156/291 |
| 2002/0150838 | A1 * | 10/2002 | Zhang et al. ................ 430/311 |
| 2003/0019568 | A1 * | 1/2003 | Liu et al. ..................... 156/245 |
| 2004/0118586 | A1 * | 6/2004 | Hua ........................... 174/52.2 |
| 2004/0156583 | A1 * | 8/2004 | Totani et al. ................ 385/24 |
| 2005/0023656 | A1 * | 2/2005 | Leedy ......................... 257/678 |
| 2005/0109820 | A1 * | 5/2005 | Milewski et al. ...... 228/180.22 |

OTHER PUBLICATIONS

Roman, John W., et al., "Low Stress Die Attach by Low Temperature Transient Liquid Phase Bonding", *The International Societ for Hybrid Microelectronics (ISHM) Symposium Proceedings*, Oct. 1992, 1-6.

* cited by examiner

*Primary Examiner*—Kiley Stoner
(74) *Attorney, Agent, or Firm*—Schwegman, Lundberg & Woessner, P.A.

(57) ABSTRACT

In some example embodiments, a method includes engaging a first contact on a motherboard with a second contact on an electronic package. A portion of one of the first and second contacts is covered with an interlayer that has a lower melting temperature than both of the first and second contacts. The method further includes bonding the first contact to the second contact by melting the interlayer to diffuse the interlayer into the first and second contacts. The bonded first and second contacts have a higher melting temperature than the interlayer before melting. In other example embodiments, an electronic assembly includes a motherboard having a first contact that is bonded to a second contact on an electronic package. An interlayer is diffused within the first and second contacts such that they have a higher melting temperature than the interlayer before the interlayer is diffused into the first and second contacts.

13 Claims, 3 Drawing Sheets

10

22
```
COVERING THE PORTION OF ONE OF THE FIRST AND SECOND CONTACTS WITH THE INTERLAYER
```
- COVERING A PORTION OF BOTH THE FIRST AND SECOND CONTACTS WITH THE INTERLAYER
- COVERING A PORTION OF BOTH THE FIRST AND SECOND CONTACTS WITH THE INTERLAYER
- COVERING ALL EXPOSED PORTIONS OF ONE OF THE FIRST AND SECOND CONTACTS WITH THE INTERLAYER
- ELECTROPLATING THE INTERLAYER ONTO THE PORTION OF ONE OF THE FIRST AND SECOND CONTACTS

15
```
ENGAGING A FIRST CONTACT ON A MOTHERBOARD WITH A SECOND CONTACT ON AN ELECTRONIC
PACKAGE, A PORTION OF ONE OF THE FIRST AND SECOND CONTACTS BEING COVERED WITH AN
INTERLAYER THAT HAS LOWER MELTING TEMPERATURE THAN THE FIRST AND SECOND CONTACTS
```
- PRESSING THE FIRST CONTACT AGAINST THE SECOND CONTACT

20
```
BONDING THE FIRST CONTACT TO THE SECOND CONTACT BY MELTING THE INTERLAYER TO DIFFUSE
THE INTERLAYER INTO THE FIRST AND SECOND CONTACTS, THE BONDED FIRST AND SECOND
CONTACTS HAVING A HIGHER MELTING TEMPERATURE THAN THE INTERLAYER BEFORE MELTING
```
- EXPOSING THE INTERLAYER AND THE FIRST AND SECOND CONTACTS TO AN ENVIRONMENT
  HAVING A TEMPERATURE GREATER THAN THE MELTING TEMPERATURE OF THE INTERLAYER
  BUT BELOW THE MELTING TEMPERATURE OF THE FIRST AND SECOND CONTACTS
    - MAINTAINING THE INTERLAYER AND THE FIRST AND SECOND CONTACTS WITHIN THE
      ENVIRONMENT UNTIL A PORTION OF THE INTERLAYER DIFFUSES INTO THE FIRST AND
      SECOND CONTACTS
        - MAINTAINING THE INTERLAYER AND THE FIRST AND SECOND CONTACTS
          WITHIN THE ENVIRONMENT UNTIL A MAJORITY OF THE INTERLAYER
          DIFFUSES INTO THE FIRST AND SECOND CONTACTS.
            - MAINTAINING THE INTERLAYER AND THE FIRST AND SECOND
              CONTACTS WITHIN THE ENVIRONMENT UNTIL THE INTERLAYER IS
              SUBSTANTIALLY DIFFUSED INTO THE FIRST AND SECOND
              CONTACTS.
- EXPOSING THE INTERLAYER AND THE FIRST AND SECOND CONTACTS TO THE ENVIRONMENT
  FOR A PERIOD OF TIME
    - EXPOSING THE INTERLAYER AND THE FIRST AND SECOND CONTACTS TO THE
      ENVIRONMENT UNTIL THE INTERLAYER MELTS AND THEN SOLIDIFIES WITHIN THE
      FIRST AND SECOND CONTACTS
- EXPOSING THE INTERLAYER AND THE FIRST AND SECOND CONTACTS TO AN ENVIRONMENT
  HAVING A TEMPERATURE LESS THAN 125 DEGREES CENTIGRADE

*Fig. 1*

SOLDERING AN ELECTRONICS PACKAGE TO A MOTHERBOARD

TECHNICAL FIELD

Some example embodiments of the present invention relate to connecting an electronic package to a motherboard, and more particularly, to soldering an electronic package to a motherboard.

BACKGROUND

The current paths in electronic assemblies that include processors are continually being required to handle ever-increasing amounts of current in order to power the processors. Processors typically require more power in order to operate at higher frequencies and to simultaneously perform numerous logic and memory operations. Each increase in processing speed and power generally carries a cost of increased heat generation within electronic assemblies that include processors. As processor power densities continue to increase, so too does the structural and thermal challenge of adhering electronic packages that include processors to a motherboard.

One example method of attaching an electronic package to a motherboard includes soldering the electronic package to the motherboard. One drawback with soldering the electronic package to the motherboard is that the various components contract at different rates during bonding due to differences in the coefficients of thermal expansion for the materials that form the electronic package, solder and motherboard. Since the electronic package, solder and motherboard contract at different rates, stress forms within the electronic package, solder and motherboard as the solder hardens to bond the electronic package to the motherboard.

Most conventional solders have re-flow temperatures around 183° C. and above. This relatively high re-flow temperature leads to significant temperature changes within the electronic package, solder and motherboard as the solder is re-flowed to connect an electronic package to a motherboard. The large temperature change generates significant expansion and contraction within the electronic package, solder and motherboard as the solder is re-flowed and then cooled. The significant expansion and contraction causes stress within the components as the solder hardens. The stress within the components makes the electronic assemblies that include such components vulnerable to unwanted cracking.

One example relates to when a motherboard is mounted within a chassis that is shipped to an end user. The electronic package, solder and motherboard within such electronic assemblies are under stress such that they are particularly vulnerable to the shock and vibration forces generated during shipping.

In addition, the high re-flow temperature of some solders is simply not acceptable for many heat-sensitive devices (e.g., optoelectronic devices). Many electronic assemblies require a re-flow temperature that is less than 125° C. in order to connect an electronic package to a motherboard.

Devices that require a low re-flow temperatures leave only a small thermal window for assembly, as many devices operate at a working temperature around 80° C. The small thermal window is problematic because there are a limited number of solders that have such a low melting temperature ($T_m$). In addition, many low $T_m$ solders also include an undesirable toxic element (e.g., cadmium).

There are some conventional solders that have a $T_m$ around 100° C. or less. Solders with such low $T_m$ typically cannot be used in most electronic assemblies because their $T_m$ is too close to, or below, the working temperature of many electronic assemblies.

One available alternative is to use adhesives to attach an electronic package to a motherboard. However, adhesives are limited in both thermal and electrical conductivity. Solder alloys are desirable because of their relatively high electrical and thermal conductivities.

BRIEF DESCRIPTION OF THE DRAWINGS

FIG. 1 illustrates a method that includes engaging a first contact on a motherboard with a second contact on an electronic package.

DETAILED DESCRIPTION

Figure 2:
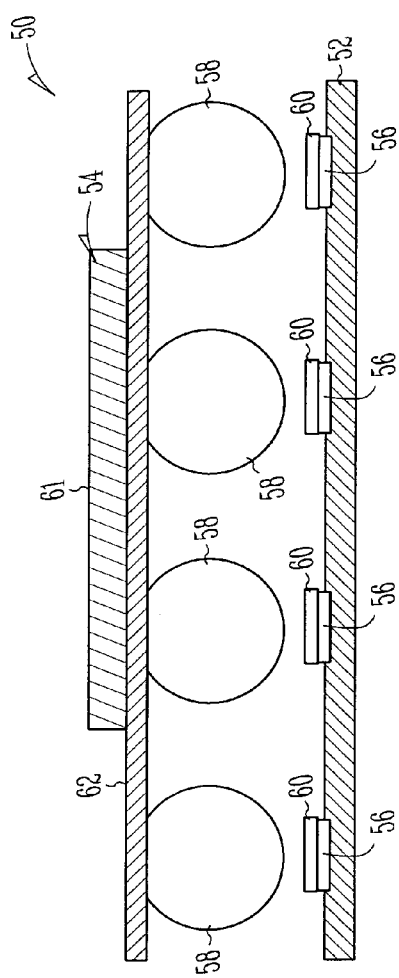
FIG. 2 is a schematic section view of an electronic assembly before an electronic package is bonded to a motherboard.

The following detailed description references the accompanying drawings. Like numerals describe substantially similar components throughout each of the drawings. Other embodiments may be used, and structural, logical, and electrical changes made. The integrated circuit described herein can be manufactured, used, or shipped in a number of positions and orientations.

FIG. 1 illustrates one example embodiment of a method 10 that includes 15 engaging a first contact on a motherboard with a second contact on an electronic package. A portion of one of the first and second contacts is covered with an interlayer that has a lower melting temperature than both of the first and second contacts. The method further includes 20 bonding the first contact to the second contact by melting the interlayer to diffuse the interlayer into the first and second contacts. The bonded first and second contacts have a higher melting temperature than the interlayer before melting.

In some embodiments, 20 bonding the first contact to the second contact includes exposing the interlayer and the first and second contacts to an environment having a temperature greater than the melting temperature of the interlayer but below the melting temperature of the first and second contacts. As an example, the interlayer and the first and second contacts may be exposed to a temperature less than 125° C. In addition, exposing the interlayer and the first and second contacts to an environment may include maintaining the interlayer and the first and second contacts within the environment until (i) a portion of the interlayer diffuses into the first and second contacts; (ii) a majority of the interlayer diffuses into the first and second contacts; or (iii) the interlayer is substantially diffused into the first and second contacts.

Exposing the interlayer and the first and second contacts to an environment may also include exposing the interlayer and the first and second contacts to the environment for a period of time (e.g., minutes, hours or days). The interlayer and the first and second contacts may be exposed to the environment until the interlayer melts and then solidifies within the first and second contacts. It should be noted that the longer the interlayer and the first and second contacts are exposed to the environment, the more the interlayer may be diffused into the first and second contacts.

It should be noted that 20 bonding the first contact to the second contact by melting the interlayer to diffuse the interlayer into the first and second contacts may be done at a relatively low temperature depending on the type of interlayer. Bonding at a relatively low temperature reduces the stress in the bond between the electronic package and motherboard.

Once the interlayer is diffused into the first and second contacts, the re-flow temperature of the bonded first and second contacts is higher than the original melting temperature of the interlayer. The higher re-flow temperature allows an electronic assembly that includes an electronic package bonded to a motherboard to operate at higher temperatures.

The method 10 may further include 22 covering a portion of one of a first contact and a second contact with an interlayer (e.g., by electroplating, among other processes). It should be noted that 22 covering the portion of one of the first and second contacts with the interlayer may include (i) covering a portion of both of the first and second contacts with the interlayer; and/or (ii) covering all exposed portions of one of the first and second contacts with the interlayer.

FIG. 2 illustrates an electronic assembly 50 that includes a motherboard 52 and an electronic package 54. The motherboard 52 includes a first contact 56 that is bonded to a second contact 58 on electronic package 54. Electronic assembly 50 further includes an interlayer 60 that is diffused within first contact 56 and second contact 58 when electronic package 54 is bonded to motherboard 52 (see FIGS. 3 and 4). The bonded first and second contacts 56, 58 have a higher melting temperature than the interlayer 60 before the interlayer 60 is diffused into the first and second contacts 56, 58.

In the example embodiment shown in FIG. 2, first contact 56 is a pad and second contact 58 is a ball. It should be noted that first and second contacts 56, 58 may be any size, shape or geometry that permits the electronic package 54 to be bonded to motherboard 52.

In addition, first and second contacts 56, 58 may be made from the same material or different materials. Some example materials for first and second contacts 56, 58 include gold, silver, copper, tin and alloys comprised of any combination of tin, bismuth, lead and/or indium as long as the first and second contacts 56, 58 have a higher melting temperature than the interlayer 60. Some example materials for interlayer 60 include:

| INTERLAYER (% BY WEIGHT) | $(T_m)$ ° C. |
|---|---|
| 52In-48Sn | 118 |
| 66.3Bi-33.4In-0.3Zn | 107.86 |
| 46Bi-34Sn-20Pb | 96 |
| 52.2In-47.4Sn-0.4Zn | 85.7 |
| 57Bi-26In-17Sn | 79 |
| 66.3In-33.7Bi | 72 |
| 66.9In-22.6Bi-0.5Zn | 67.7 |
| 51In-32.5Bi-16.5Sn | 60 |
| 49Bi-21In-18Pb-12Sn | 58 |

Figure 4:
FIG. 4 is an enlarged schematic view similar to FIG. 3 that illustrates another example embodiment of an assembled portion of the electronic assembly shown in FIG. 2.
Figure 3:
FIG. 3 is an enlarged schematic view illustrating an assembled portion of the electronic assembly shown in FIG. 2.

FIG. 3 shows that interlayer 60 is uniformly diffused within first and second contacts 56, 58. It should be noted that in other embodiments interlayer 60 may not be uniformly diffused into first and second contacts 56, 58. As an example, FIG. 4 shows that interlayer 60 may be diffused within first and second contacts 56, 58 such that much of interlayer 60 is located near the area 63 where first contact 56 was mated with second contact 58. The degree of diffusion that interlayer 60 has within first and second contacts 56, 58 will depend on the temperature at which interlayer 60 is re-flowed, and the amount of time that interlayer 60 and first and second contacts 56, 58 are exposed to the re-flow temperature.

The types of materials that are selected for the interlayer 60 and the first and second contacts 56, 58 will depend on the application where the electronic assembly 50 is to be used. One important factor to consider when selecting materials is that there should be minimal formation of inter-metallic compounds between interlayer 60 and the first and second contacts 56, 58.

The melting temperature of the bonded first and second contacts 56, 58 is determined by (i) the types of materials that are used for interlayer 60 and first and second contacts 56, 58; and (ii) the degree of diffusion of interlayer 60 within first and second contacts 56, 58. In some embodiments, the bonded first and second contacts 56, 58 have a melting temperature greater than 150 degrees centigrade.

The size, type and alignment of electronic package 54 may vary depending on the design of electronic assembly 50. In addition, the components in electronic assembly 50 will be determined based on the space available and the application where electronic assembly 50 is to be used (among other factors).

As shown in FIG. 2, electronic package 54 may include a die 61 that is mounted on a substrate 62. The die 61 and substrate 62 may be at least partially encapsulated by a protective material (not shown in FIGS. 2-4). Die 61 may be made of semiconducting material that has been separated from a wafer. Wafers may be made of semiconducting, non-semiconducting, or combinations of semiconducting and non-semiconducting materials.

It should be noted that die 61 may be a processor of any type. As used herein, processor means any type of circuit such as, but not limited to, a microprocessor, a microcontroller, a graphics processor or a digital signal processor. Die 61 may also be a custom circuit or an application-specific integrated circuit, such as a communications circuit for use in wireless devices such as cellular telephones, pagers, portable computers, two-way radios, and similar electronic systems.

Figure 5:
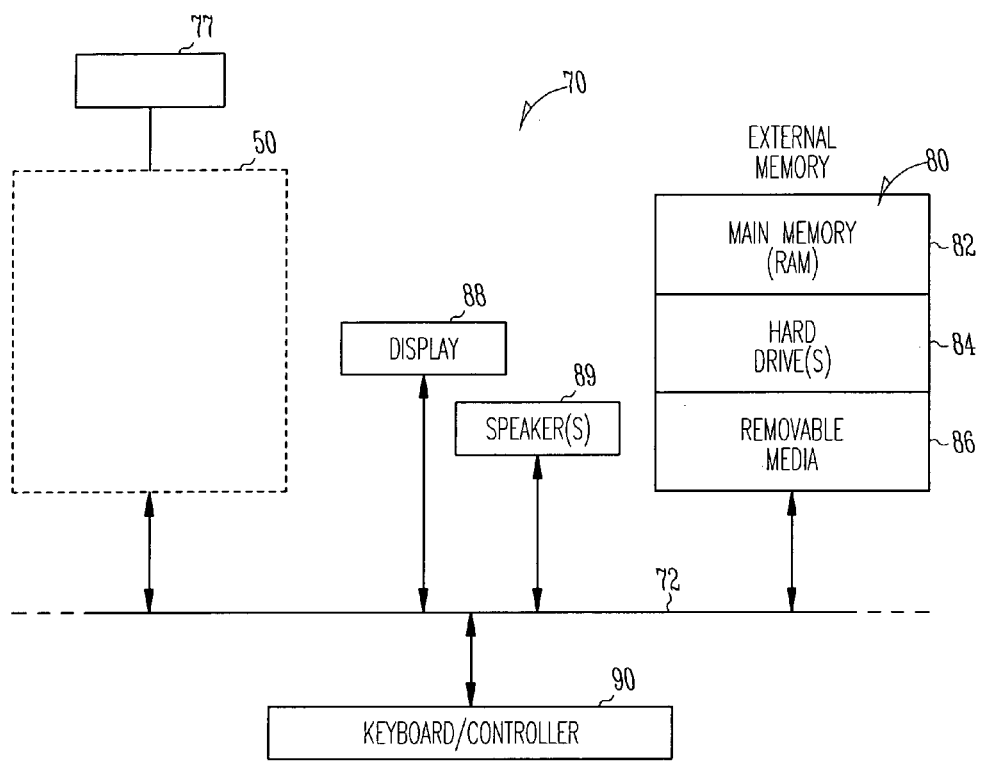
FIG. 5 is a block diagram of an electronic system that incorporates the electronic assembly shown in FIG. 2.

FIG. 5 is a block diagram of an electronic system 70 incorporating at least one electronic assembly (e.g., electronic assembly 50 shown in FIG. 2) described herein. Electronic system 70 may be a computer system that includes a system bus 72 which electrically couples the various components of electronic system 70 together. System bus 72 may be a single bus or any combination of busses.

Electronic assembly 50 is electrically coupled to system bus 72 and as discussed above may include any circuit, or combination of circuits. Electronic system 70 may also include an external memory 80 that in turn may include one or more memory elements suitable to a particular application. Some example memory elements include a main memory 82 in the form of random access memory (RAM), one or more hard drives 84, and/or one or more drives that handle removable media 86, such as diskettes, compact disks (CDs) and digital video disks (DVDs). The electronic system 70 may also include a display device 88, a speaker 89, and a controller 90, such as a keyboard, mouse, trackball, game controller, microphone, voice-recognition device, or any other device that inputs information into the electronic system 70.

In some embodiments, electronic system 70 further includes a voltage source 77 that is electrically coupled to electronic assembly 50. Voltage source 77 may be used to supply power to a die (e.g., a processor) that is within electronic assembly 50.

The methods and electronic assemblies described herein may be implemented in a number of different embodiments, including an electronic package, an electronic system, a computer system, and one or more methods of fabricating an electronic assembly. The elements, materials, geometries, dimensions, and sequence of operations can all be varied to suit particular packaging requirements.

FIGS. 1-5 are merely representational and are not drawn to scale. Certain proportions thereof may be exaggerated while others may be minimized.

The method described above may provide a solution for bonding an electronic package to a motherboard. The method may reduce the stress within the bond that connects the electronic package and motherboard. The method may also allows an electronic assembly that includes the electronic package and motherboard to function at higher operating temperature than the temperature that is required to bond the electronic package to the motherboard. Many other embodiments will be apparent to those of skill in the art from the above description.

What is claimed is:

1. A method comprising:
engaging a first contact on a motherboard with a second contact on an electronic package that includes a die bonded to a substrate, a portion of one of the first and second contacts being covered with an interlayer that has a lower melting temperature than the first and second contacts; and
bonding the first contact to the second contact by melting the interlayer to diffuse the interlayer into the first and second contacts, the bonded first and second contacts having a higher melting temperature than the interlayer before melting.

2. The method of claim 1 wherein bonding the first contact to the second contact includes exposing the interlayer and the first and second contacts to an environment having a temperature greater than the melting temperature of the interlayer but below the melting temperature of the first and second contacts.

3. The method of claim 2 wherein exposing the interlayer and the first and second contacts to an environment having a temperature greater than the melting temperature of the interlayer but below the melting temperature of the first and second contacts includes maintaining the interlayer and the first and second contacts within the environment until a portion of the interlayer diffuses into the first and second contacts.

4. The method of claim 3 wherein maintaining the interlayer and the first and second contacts within the environment until a portion of the interlayer diffuses into the first and second contacts includes maintaining the interlayer and the first and second contacts within the environment until a majority of the interlayer diffuses into the first and second contacts.

5. The method of claim 4 wherein maintaining the interlayer and the first and second contacts within the environment until a majority of the interlayer diffuses into the first and second contacts includes maintaining the interlayer and the first and second contacts within the environment until the interlayer is substantially diffused into the first and second contacts.

6. The method of claim 2 wherein exposing the interlayer and the first and second contacts to an environment includes exposing the interlayer and the first and second contacts to the environment for a period of time.

7. The method of claim 6 wherein exposing the interlayer and the first and second contacts to the environment for a period of time includes exposing the interlayer and the first and second contacts to the environment until the interlayer melts and then solidifies within the first and second contacts.

8. The method of claim 1 wherein engaging a first contact on a motherboard with a second contact on an electronic package includes pressing the first contact against the second contact.

9. The method of claim 1 wherein bonding the first contact to the second contact includes exposing the interlayer and the first and second contacts to an environment having a temperature less than 125 degrees Centigrade.

10. The method of claim 1 further comprising covering the portion of one of the first and second contacts with the interlayer.

11. The method of claim 10 wherein covering the portion of one of the first and second contacts with the interlayer includes covering a portion of both of the first and second contacts with the interlayer.

12. The method of claim 10 wherein covering the portion of one of the first and second contacts with the interlayer includes covering all exposed portions of one of the first and second contacts with the interlayer.

13. The method of claim 10 wherein covering the portion of one of the first second contacts includes electroplating the interlayer onto the portion of one of the first and second contacts.

* * * * *

UNITED STATES PATENT AND TRADEMARK OFFICE
CERTIFICATE OF CORRECTION

| | |
|---|---|
| PATENT NO. | : 7,357,293 B2 |
| APPLICATION NO. | : 10/808192 |
| DATED | : April 15, 2008 |
| INVENTOR(S) | : Suh |

Page 1 of 1

It is certified that error appears in the above-identified patent and that said Letters Patent is hereby corrected as shown below:

In column 6, line 48, in Claim 13, delete "first second" and insert -- first and second --, therefor.

Signed and Sealed this

Fifth Day of August, 2008

JON W. DUDAS
*Director of the United States Patent and Trademark Office*